(12) United States Patent
Al Kayal

(10) Patent No.: US 10,951,205 B2
(45) Date of Patent: Mar. 16, 2021

(54) PROTECTION CIRCUIT AGAINST SHORT CIRCUITS OF SWITCHING DEVICE FOR SIC OR GAN MOSFET TRANSISTOR AND ASSOCIATED METHOD

(71) Applicant: ALSTOM Transport Technologies, Saint-Ouen (FR)

(72) Inventor: Fisal Al Kayal, Wemmel (BE)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 323 days.

(21) Appl. No.: 16/026,358

(22) Filed: Jul. 3, 2018

(65) Prior Publication Data
US 2019/0013805 A1 Jan. 10, 2019

(30) Foreign Application Priority Data
Jul. 6, 2017 (FR) ..................... 17 56382

(51) Int. Cl.
*H03K 17/0814* (2006.01)
*H03K 17/082* (2006.01)
*H03K 17/687* (2006.01)

(52) U.S. Cl.
CPC ... *H03K 17/08142* (2013.01); *H03K 17/0822* (2013.01); *H03K 17/687* (2013.01); *H03K 2217/0027* (2013.01)

(58) Field of Classification Search
CPC ......... H03K 17/08142; H03K 17/0822; H03K 17/687; H03K 2217/0027
USPC ......................................................... 361/93.1
See application file for complete search history.

(56) References Cited

U.S. PATENT DOCUMENTS

| | | | | |
|---|---|---|---|---|
| 4,054,805 A | * | 10/1977 | Stebbins | G01R 19/145 327/430 |
| 4,382,229 A | * | 5/1983 | Cottrell | G01R 31/2621 324/762.09 |
| 2004/0240240 A1 | * | 12/2004 | Bijlenga | H02M 7/4826 363/56.12 |
| 2016/0204097 A1 | | 7/2016 | Laven et al. | |

OTHER PUBLICATIONS

Jamshidpour E et al: "Fault tolerant operation of single-ended non-isolated DC-DC converters under open and short-circuit switch faults", 2013 15th European Conference on Power Electronics and Applications (EPE), IEEE, Sep. 2, 2013 (Sep. 2, 2013), pp. 1-7, XP032505482, DOI: 10.1109/EPE.2013.6634471 [extrait le Oct. 16, 2013] * figure 3 *.
Preliminary Search Report for FR 17 56382, dated Mar. 6, 2018.

\* cited by examiner

*Primary Examiner* — Kevin J Comber
(74) *Attorney, Agent, or Firm* — B. Aaron Schulman, Esq.; Stites & Harbison, PLLC.

(57) ABSTRACT

The invention relates to a power switching device having at least one transistor of the SiC or GaN MOSFET type able to be traveled by a main current. The power switching device has at least one measuring module configured to indirectly measure the main current of the transistor from the electromagnetic field produced by the transistor and at least one protection circuit configured to detect a short-circuit based on the sign of the temporal drift of the main current.

8 Claims, 3 Drawing Sheets

PROTECTION CIRCUIT AGAINST SHORT CIRCUITS OF SWITCHING DEVICE FOR SIC OR GAN MOSFET TRANSISTOR AND ASSOCIATED METHOD

The present invention relates to a power switching device comprising at least one transistor of the SiC or GaN MOSFET type able to be traveled by a main current.

In a manner known in itself, a transistor of the SiC or GaN MOSFET ("Silicon Carbide", "Gallium Nitride" and "Metal Oxide Semiconductor Field Effect Transistor", respectively) type, also called insulated gate bipolar transistor, comprises three electric terminals or contacts, i.e., a gate, a drain and a source.

In particular, a transistor of the SiC or GaN MOSFET type can be used as an electric switch. Indeed, such a transistor defines an on state, in which the drain is electrically connected to the source, and an off state, in which the drain and the source are electrically isolated from one another.

The switching between the two states is controlled by a setpoint voltage applied on the gate by suitable control means.

In particular, the switching between the off state and the on state comprises a phase for switching to firing consisting of switching the transistor from the off state to the on state, and a phase for switching off consisting of switching the transistor from the on state to the off state.

Generally, the operation of an SiC or GaN MOSFET transistor is controlled by a suitable switching device in particular making it possible to detect a short circuit within the electrical network in which the transistor is used.

Such a short circuit may for example appear between the drain and the source of a SiC or GaN MOSFET transistor.

To detect a short circuit, the existing switching devices use a protection circuit directly measuring the voltage between the drain and the source and detecting a short-circuit based on these measurements. In other words, in the existing devices, the protection circuit is connected to the drain on the one hand, and to the source on the other hand, to measure the voltage directly.

However, the existing switching devices and the methods for short circuit detection implemented by these devices are not fully satisfactory.

Indeed, the existing devices are inherited from IGBT (Insulated Gate Bipolar Transistor) transistors. Such devices are not suitable for transistors of the SiC or GaN MOSFET type.

Transistors of the SiC or GaN MOSFET type are able to reach higher switching speeds, and therefore switching frequencies, than those of IGBT-type transistors. This makes it possible to reduce the volume, weight and cost of the components used in the switching device.

However, the electromagnetic interference generated during high-frequency operation of the SiC or GaN MOSFET-type transistors is non-negligible. In particular, they generate a common-mode current that disrupts the electronic components near the transistor, including the protection circuit connected to both the drain and the source.

In the case of a transistor of the SiC or GaN MOSFET type switching at high frequencies, the common-mode current is great enough to trigger false alarms that will cause the switching device to stop. It is then necessary to insert reinforced filtering to filter the common-mode current between the source and the protection circuit.

Furthermore, unlike transistors of the IGBT type, transistors of the SiC or GaN MOSFET type do not unload in short circuit. The short circuit current is therefore not limited by unloading for transistors of the SiC or GaN MOSFET type, which is, however, the case for IGBT transistors.

Furthermore, the resistance to the on state of a transistor of the SiC or GaN MOSFET type being much lower than for a transistor of the IGBT type, the short circuit current is much greater in the case of a transistor of the SiC or GaN MOSFET type than in the case of a transistor of the IGBT type.

In order to avoid the destruction of a transistor of the SiC or GaN MOSFET type, it is therefore necessary for the reaction time of the protection circuit to be very short, around one or two microseconds.

This reactivity constraint requires lightening the filtering at the input of the protection circuit. At the same time, as previously explained, the filtering at the input of the protection circuit must be reinforced to filter the common-mode current.

The existing devices then do not make it possible to obtain a satisfactory compromise between reactivity of the protection circuit and immunity of the same circuit to the electromagnetic interference produced when the transistor operates at a high frequency.

This problem is particularly relevant in the railroad field, where transistors of the SiC or GaN MOSFET type operate at a high frequency.

The present invention aims to propose a SiC or GaN MOSFET transistor switching device that performs well and is robust for high switching speeds.

To that end, the invention relates to a power switching device comprising at least one SiC or GaN MOSFET transistor able to be traveled by a main current; the switching device comprising at least one measuring module configured to indirectly measure the main current of the transistor from the electromagnetic field produced by the transistor and at least one protection circuit configured to detect a short-circuit based on the sign of the temporal drift of the main current.

Thus, relative to the existing protection circuits, the present invention is based on a current (and not voltage) measurement, which, furthermore, it is an indirect measurement of the current, from the electromagnetic field radiated by the transistor, which allows uncoupling between the disruption source (i.e., the transistor) and the protection circuit.

Indeed, according to the present invention, "indirect" means that the protection circuit is not connected to the source of the transistor, which makes it possible to protect it from the common-mode current generated by the transistor in case of short circuit.

According to other advantageous aspects of the invention, the method comprises one or more of the following features, considered alone or according to all technically possible combinations:

the measuring module comprises an antenna galvanically isolated from the transistor;
the antenna is located in a circle, the center of which is the transistor and the radius of which is comprised between 1 mm and 10 cm;
the switching device comprises multiple transistors;
the switching device comprises as many measuring modules as transistors, each transistor being associated with a separate measuring module, each measuring module being configured to measure the main current traveling the transistor with which it is associated;
each measuring module is electromagnetically isolated from at least one electromagnetic field other than that produced by the transistor with which it is associated;

each measuring module and its associated transistor are arranged in a Faraday cage;

each transistor is associated with an observation window for the sign of the temporal drift of the main current traveling it, the observation window being able to be triggered simultaneously with the switching of the transistor from an off state to an on state, the observation windows being separate from one another;

the switching device comprises a single measuring module configured to measure the main current traveling each transistor;

each transistor is associated with an observation window for the sign of the temporal drift of the main current traveling it, the observation window being able to be triggered simultaneously with the switching of the transistor from an off state to an on state, the observation windows being separate from one another.

These features and advantages of the invention will appear upon reading the following description, provided solely as a non-limiting example, and done in reference to the appended drawings, in which:

FIGS. 1 to 3 show a power switching device 10 intended to convert electrical energy.

The power switching device 10 is in particular able to be used in the railway field, and is for example on board a railway vehicle.

Figure 1:
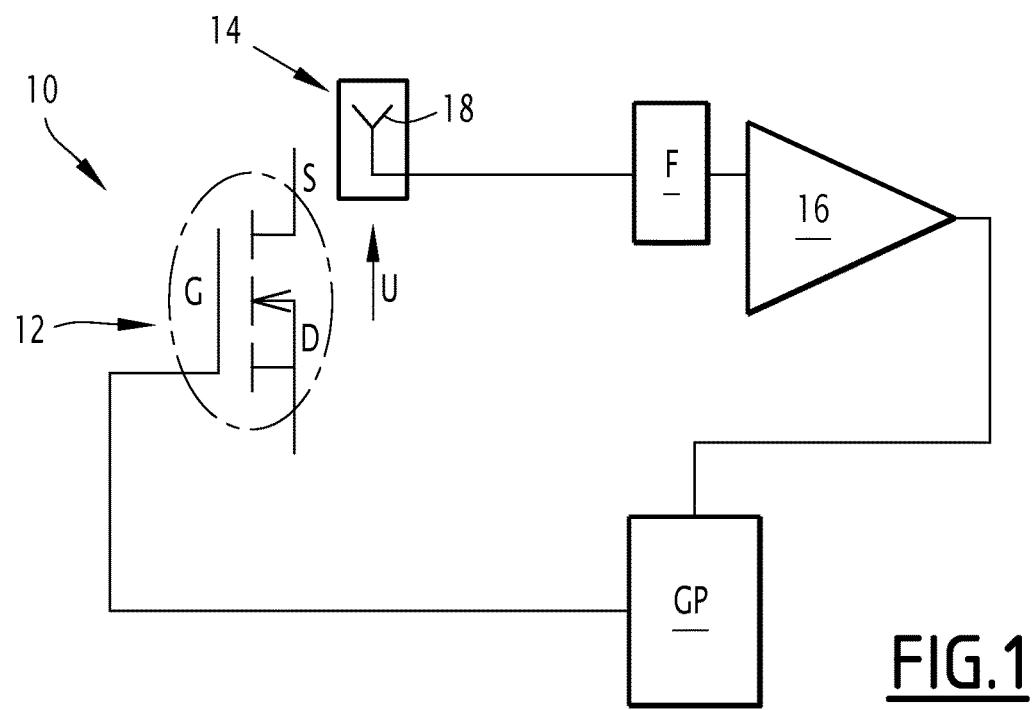
FIG. 1 is a schematic view of a power switching device according to a first embodiment of the invention.

In reference to FIG. 1, the switching device 10 comprises at least one transistor 12, at least one measuring module 14 and at least one protection circuit 16.

The transistor 12 is a transistor of the SiC or GaN MOSFET ("Silicon Carbide", "Gallium Nitride" and "Metal Oxide Semiconductor Field Effect Transistor", respectively) type, also called insulated gate bipolar transistor.

The transistor 12 is known in itself and in particular comprises three electrical terminals or contacts, namely a gate G, a drain D and a source S.

The transistor 12 defines an on state in which an electrical current I, hereinafter called main current, flows between the drain D and the source S, and an off state, in which the drain D is electrically isolated from the source S.

The measuring module 14 is configured to indirectly measure the intensity of the main current I passing in the transistor 12 from an electromagnetic field produced by the transistor 12.

Indeed, the electromagnetic field radiated by the transistor 12 is, by definition, the image of the main current I according to a bijective relationship, the electromagnetic field radiated by the transistor inducing, by definition, a common-mode current. Thus, the measured electromagnetic field is more powerful in the presence than in the absence of short circuit within the transistor 12.

Thus, indirectly, by using the electromagnetic field radiated by the transistor 12, the measuring module 14 is able to detect any change in the intensity of the main current I traveling the transistor 12.

In other words, the measuring module 14 makes it possible to detect any increase or decrease in the intensity values of the main current I over time.

Put differently, the measuring module 14 makes it possible to detect the sign of the temporal derivative dI/dt of the main current I.

Preferably, the measuring module 14 comprises an antenna 18, galvanically isolated from the transistor 12, and able to measure the electromagnetic field radiated by the transistor 12. The electromagnetic field produced by the transistor 12 is received via the antenna 18, and a common-mode current is induced, the intensity of which, determined within the measuring module 14, is correlated with the intensity of the main current I traveling the transistor 12.

Advantageously, the antenna 18 is located in a circle, the center of which is the transistor 12 and the radius of which is comprised between 1 mm and 10 cm in order to obtain a precise enough measurement of the electromagnetic field radiated by the transistor 12.

Traditionally, the protection circuit 16 is able to be connected on the one hand to a filtering circuit F configured to filter the electromagnetic interference (IEM) of the electromagnetic signal radiated by the transistor and received within the measuring module 14, and on the other hand to a pulse generator GP configured to generate a setpoint voltage.

In other words, according to the present invention, the protection circuit 16 is not connected directly, or via the filtering circuit F, to the source S of the transistor 12, which makes it possible to protect the protection circuit 16 from the common-mode current generated in the presence of a short circuit of the transistor 12.

Furthermore, the protection circuit 16 is able to control the operation of the transistor 12 by applying, via the pulse generator GP, a setpoint voltage and a setpoint current on the gate G.

The protection circuit 16 is further connected, via the filtering circuit F, to the measuring module 14 to recover indirect measurements of the sign of dI/dt from the electromagnetic field radiated by the transistor 12.

The protection circuit 16 is further able to implement a method for detecting a short circuit 100, described in more detail later, in a predetermined temporal observation window $T_{obs}$.

Figure 2:
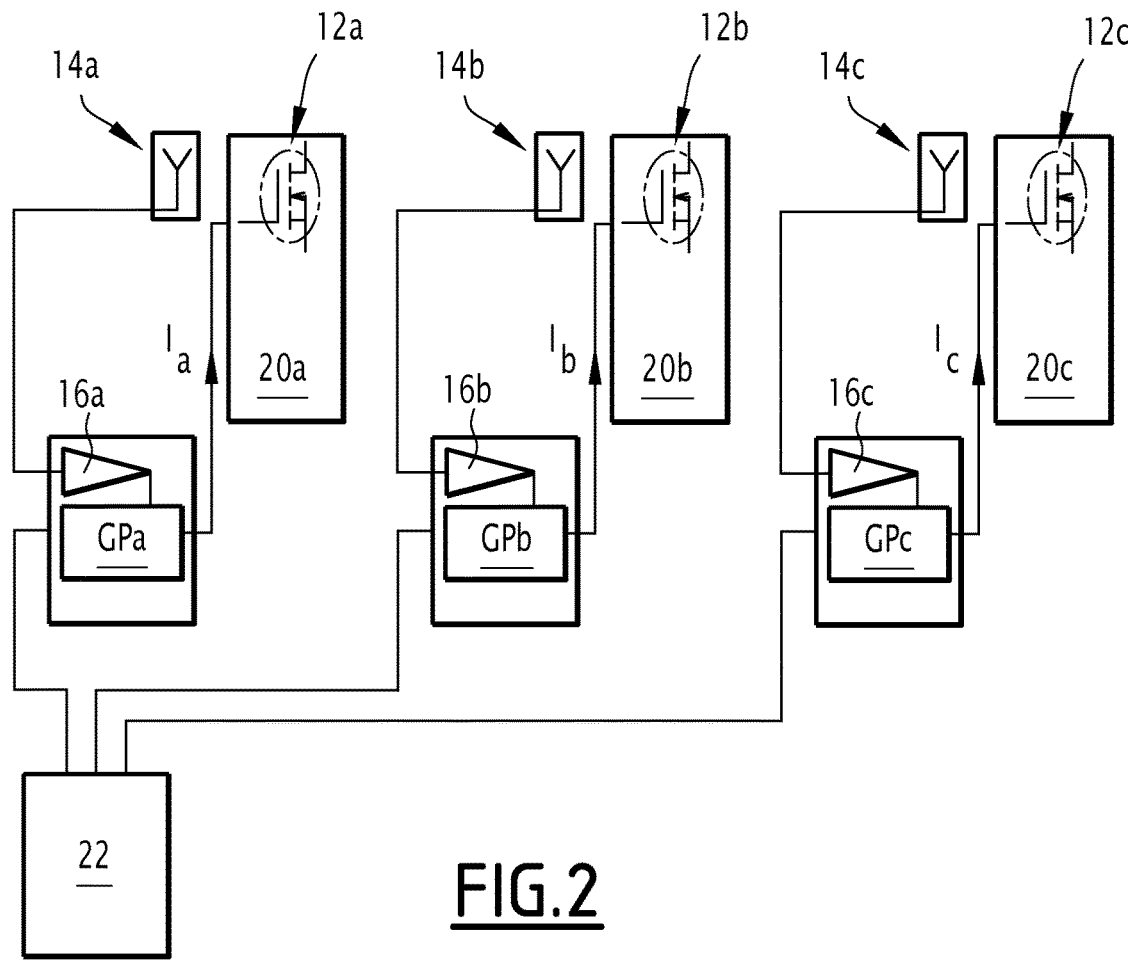
FIG. 2 is a schematic view of a power switching device according to a second embodiment of the invention.
Figure 3:
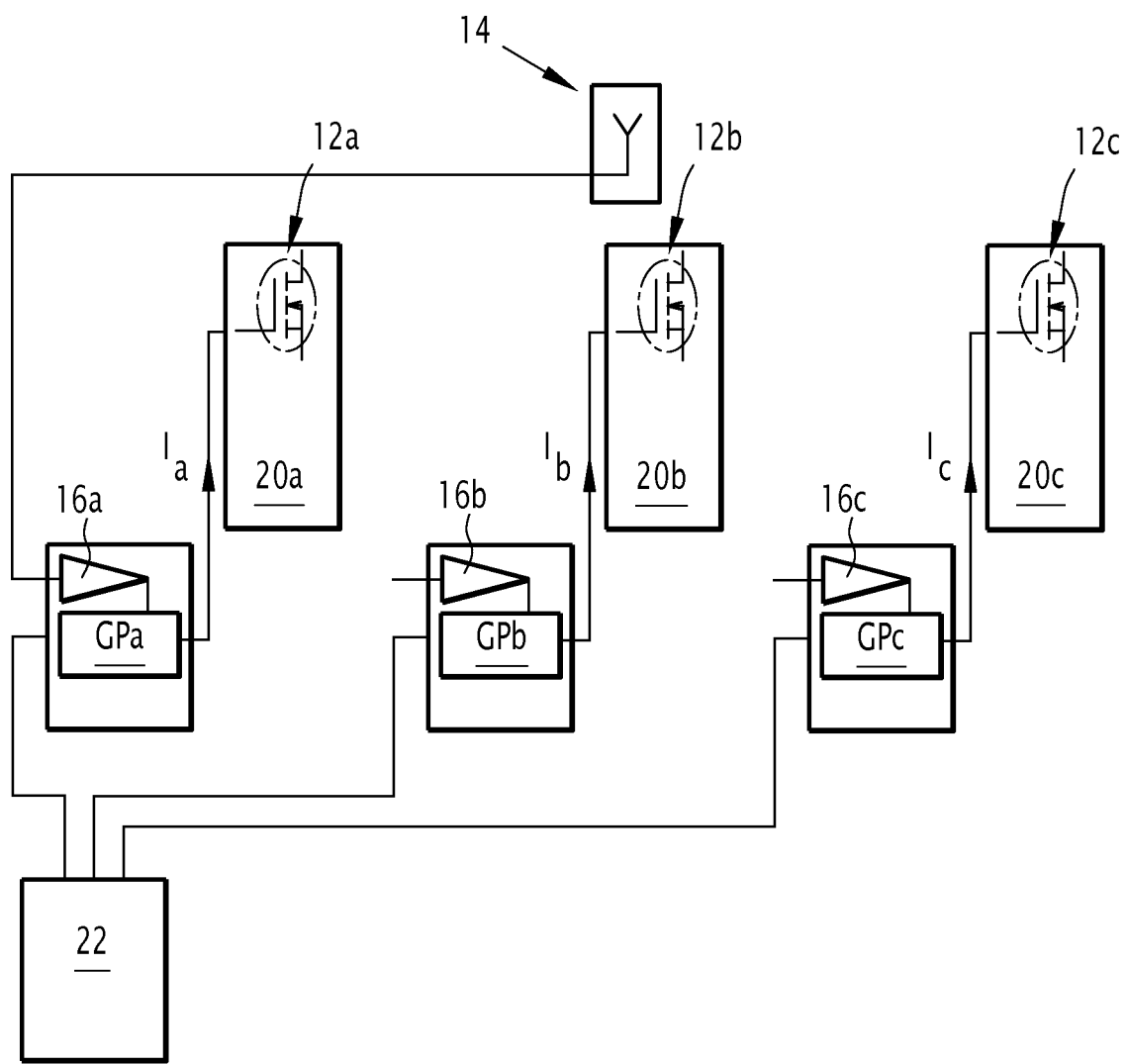
FIG. 3 is a schematic view of a power switching device according to a third embodiment of the invention.

In the embodiments shown in FIGS. 2 and 3, the device 10 includes multiple power assemblies (i.e., "packs" or "switches"), for example, three packs 20a, 20b and 20c, and a control unit 22 configured to control the switching of the transistors 12a, 12b and 12c of each pack. To that end, the control unit 22 is connected to the pulse generators GPa, GPb and GPc.

The power pack 20a comprises a transistor 12a associated with a protection circuit 16a, a pulse generator GPa. The transistor 12a is traveled by a main current Ia.

The power pack 20b comprises a transistor 12b associated with a protection circuit 16b, a pulse generator GPb. The transistor 12b is traveled by a main current Ib.

The power pack 20c comprises a transistor 12c associated with a protection circuit 16c, a pulse generator GPc. The transistor 12c is traveled by a main current Ic.

The power packs 20a, 20b and 20c benefit from a similar configuration (i.e., same switching speed, same equipment, etc.).

Alternatively, at least one power pack 20a, 20b and 20c is different from the other packs.

In order to avoid the electromagnetic disruptions generated by one power pack over the adjacent power packs, several alternative embodiments are considered, and potentially combined, according to the present invention.

According to a first alternative, not shown, each pack 20a, 20b and 20c is respectively associated with an observation window $T_{obs.a}$, $T_{obs.b}$ and $T_{obs.c}$ that is dedicated to it by the control unit 22.

Preferably, the observation windows $T_{obs.a}$, $T_{obs.b}$ and $T_{obs.c}$ are separate, i.e., preferably noncontiguous over time.

The observation window $T_{obs.a}$ begins simultaneously with the switching from an off state to an on state of the associated transistor 12a. Likewise, the observation window $T_{obs.b}$ begins simultaneously with the switching from an off state to an on state of the associated transistor 12b and the observation window $T_{obs.c}$ begins simultaneously with the switching from an off state to an on state of the associated transistor 12c.

Thus, in the observation window $T_{obs.a}$, the switching of the transistors 12b and 12c from an off state to an on state does not disrupt the measurement of the electromagnetic field radiated by the transistor 12a.

The control unit 22 is able to switch the transistors 12a, 12b and 12c independently from an on state to an off state or from an off state to an on state.

According to a second alternative, which may or may not be combined with the first alternative, illustrated by FIG. 2, the device 10 includes three measuring modules 14a, 14b and 14c respectively associated with the power packs 20a, 20b and 20c.

More specifically, the measuring modules 14a, 14b and 14c are configured to measure the main currents Ia, Ib and Ic indirectly from electromagnetic fields radiated respectively by the transistors 12a, 12b and 12c.

Advantageously, the measuring module 14a is electromagnetically isolated from at least one electromagnetic field other than that of the transistor 12a with which it is associated. In other words, the measuring module 14a is isolated from the electromagnetic fields produced by the transistors 12b and 12c.

To that end, the measuring module 14a and the associated transistor 12a are for example placed in a Faraday cage or an electromagnetically insulated (i.e., shielded) housing, not shown.

The measuring modules 14b and 14c and the associated transistors 12b and 12c advantageously benefit from a similar configuration.

In other words, according to this alternative, individual protection of each pack is implemented.

According to a third alternative, which may or may not be combined with the first alternative, illustrated by FIG. 3, the device 10 includes a single measuring module 14.

The measuring module 14 is configured to indirectly determine the variation of the current produced by the packs from electromagnetic fields respectively radiated by the transistors 12a, 12b and 12c.

Advantageously, the measuring module 14 is located equidistantly from the transistors 12a, 12b and 12c.

The measuring module 14 communicates its measurements to the protection circuit associated with one of the packs, for example the protection circuit 16a, which, as shown in FIG. 3, processes them and transfers the processing result to the control unit 22. When this processing result identifies the presence of a short circuit, the control unit 22 generates a global opening command for all of the power packs (i.e., power switches) 20a, 20b, 20c to protect them from the detected short circuit.

In an alternative that is not shown, the protection circuit 16a is able to communicate with or be connected to the protection circuits 16b and 16c associated with the other power packs 20b and 20c.

The operation of the switching device 10 will now be explained in reference to the single-transistor embodiment of FIG. 1.

During the phase for switching the transistor 12 from the off state to the on state, the power switching device 10 carries out the method 100 for detecting a short circuit.

Figure 4:
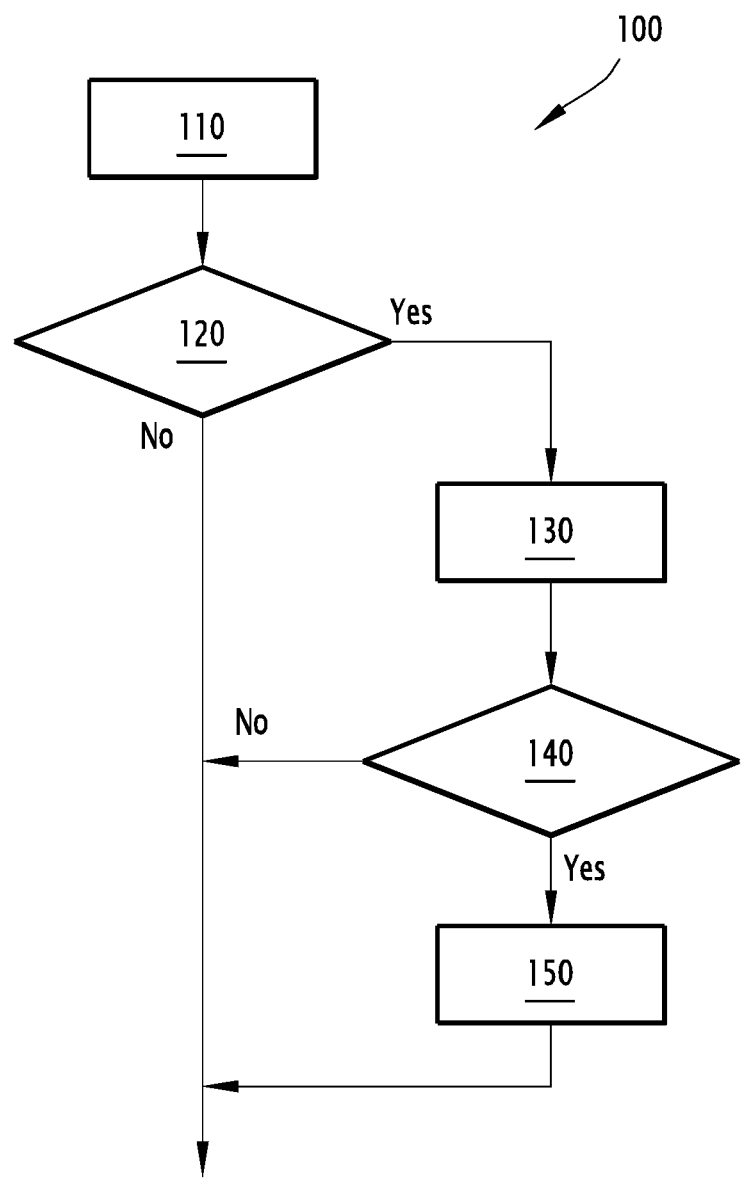
FIG. 4 is a flowchart of a short circuit detection method implemented by the switching device of FIG. 1.

In particular, this method 100 comprises several steps, the flowchart of which is illustrated in FIG. 4.

During a first step 110, the measuring module 14 measures the electromagnetic field generated by the transistor 12. From this measurement, the measuring module 14 determines the sign of the temporal drift dI/dt of the main current I.

In step 120, the protection circuit 16 observes the time of the temporal drift dI/dt of the main current I in the temporal observation window $T_{obs}$.

If the temporal drift dI/dt of the main current I is strictly positive during a test period $T_{test}$ comprised in the predetermined temporal observation window $T_{obs}$, the protection circuit 16 detects the presence of a short circuit during step 130. Otherwise, the protection circuit 16 detects the absence of short circuit.

Advantageously, the method 100 further comprises a step 140 during which the protection circuit 16 confirms the presence of the detected short circuit.

In particular, during this step 140, the protection circuit 16 confirms the presence of the short circuit when the temporal drift dI/dt of the main current I remains greater than or equal to zero for an additional period according to the test period $T_{test}$. If the temporal drift dI/dt of the main current I is strictly positive during the additional period, the protection circuit 16 detects the presence of a short circuit during step 150. Otherwise, the protection circuit 16 detects the absence of short circuit.

The additional period begins at the end of the test period $T_{test}$ and ends for example with the temporal observation window $T_{obs}$.

The test period $T_{test}$ and the additional period are comprised in the observation window $T_{obs}$.

When a short circuit has been detected, the protection circuit 16 then signals a short circuit and keeps the transistor 12 in the off state at least during a predetermined blocking period.

The test period $T_{test}$ is configurable by the protection circuit 16 and adjusted prior to carrying out the method 100, for example between ten nanoseconds and fifteen microseconds.

The length of the observation window $T_{obs}$ is configurable by the protection circuit 16 and adjusted prior to carrying out the method 100, for example between ten nanoseconds and fifteen microseconds.

One can then see that the present invention has a certain number of advantages.

The detection method according to the invention makes it possible to detect a short-circuit in the transistor by using only the analysis of the sign of the derivative dI/dt of the main current $I_c$ in different time periods.

The device according to the invention does not modify the power circuit. The switching energy losses and overvoltage risks are therefore not increased.

It should be noted that the indirect current measurements from the radiated electromagnetic field are more precise than the voltage measurements for SiC or GaN MOSFET transistors, given that the unloading voltage is highly dependent on the temperature.

Furthermore, only the sign of the drift dI/dt matters to carry out the method 100. No measurement of the value of the main current I or that of its drift dI/dt are necessary, which makes it possible to simplify the requirements imposed on the various measuring means.

This is particularly advantageous for transistors operating under high voltage, in particular those used in the railway field.

Furthermore, the sign of the drift dI/dt is measured by an indirect measurement from the electromagnetic field radiated by the transistor 12.

Thus, the protection circuit 16 is not affected by the common-mode current, since it is not directly, or via the filtering circuit F, connected to the source S of the SiC or GaN MOSFET transistor. This also means that the device 10 is much less sensitive to the electromagnetic compatibility EMC of the protection circuit 16 relative to the existing devices. There is therefore no need to reinforce the filtering F, such that the reaction time of the protection circuit 16 is reduced relative to the existing devices.

The invention claimed is:

1. A power switching device comprising at least one transistor of the SiC or GaN MOSFET type traveled by a main current;
wherein the switching device comprises at least one measuring module configured to indirectly measure the main current of the transistor from an electromagnetic field produced by the transistor and at least one protection circuit configured to detect a short-circuit based on a sign of a temporal drift of the main current;
wherein the measuring module comprises an antenna galvanically isolated from the transistor; and
wherein the antenna is located in a circuit, the center of which is the transistor and the radius of which is comprised between 1 mm and 10 cm.

2. The switching device according to claim 1, wherein the switching device comprises multiple transistors.

3. The switching device according to claim 2, wherein the switching device comprises as many measuring modules as transistors, each transistor being associated with a separate measuring module, each measuring module being configured to measure the main current traveling the transistor with which it is associated.

4. The switching device according to claim 3, wherein each measuring module is electromagnetically isolated from at least one electromagnetic field other than that produced by the transistor with which it is associated.

5. The switching device according to claim 4, wherein each measuring module and its associated transistor are arranged in a Faraday cage.

6. The switching device according to claim 2, wherein each transistor is associated with an observation window for the sign of the temporal drift of the main current traveling it, the observation window triggered simultaneously with switching of the transistor from an off state to an on state, the observation windows being separate from one another.

7. The switching device according to claim 2, wherein the switching device comprises a single measuring module configured to measure the main current traveling each transistor.

8. The switching device according to claim 7, wherein each transistor is associated with an observation window for the sign of the temporal drift of the main current traveling it, the observation window triggered simultaneously with switching of the transistor from an off state to an on state, the observation windows being separate from one another.

* * * * *